United States Patent [19]
Dill et al.

[11] Patent Number: 6,023,395
[45] Date of Patent: Feb. 8, 2000

[54] MAGNETIC TUNNEL JUNCTION MAGNETORESISTIVE SENSOR WITH IN-STACK BIASING

[75] Inventors: Frederick Hayes Dill, South Salem, N.Y.; Robert Edward Fontana, Jr., San Jose, Calif.; Tsann Lin, Saratoga, Calif.; Stuart Stephen Papworth Parkin, San Jose, Calif.; Ching Hwa Tsang, Sunnyvale, Calif.

[73] Assignee: International Business Machines Corporation, Armonk, N.Y.

[21] Appl. No.: 09/087,334

[22] Filed: May 29, 1998

[51] Int. Cl.[7] .................................................. G11B 5/39
[52] U.S. Cl. ............................................................ 360/113
[58] Field of Search ..................... 360/113; 257/421–427; 365/158, 171, 173

[56] References Cited

U.S. PATENT DOCUMENTS

| | | | |
|---|---|---|---|
| 3,623,038 | 11/1971 | Franklin et al. | 340/174 TF |
| 5,018,037 | 5/1991 | Krounbi et al. | 360/113 |
| 5,390,061 | 2/1995 | Nakatani et al. | 360/113 |
| 5,416,353 | 5/1995 | Kamiguchi et al. | 257/421 |
| 5,432,734 | 7/1995 | Kawano et al. | 365/158 |
| 5,465,185 | 11/1995 | Heim et al. | 360/113 |
| 5,528,440 | 6/1996 | Fontana et al. | 360/113 |
| 5,695,864 | 12/1997 | Slonczewski | 428/212 |
| 5,726,837 | 3/1998 | Nakatani et al. | 360/113 |
| 5,729,410 | 3/1998 | Fontana et al. | 360/133 |
| 5,898,547 | 4/1999 | Fontana, Jr. et al. | 360/113 |

FOREIGN PATENT DOCUMENTS

WO 95/10123   4/1995   WIPO .

OTHER PUBLICATIONS

M. Julliere, "Tunneling Between Ferromagnetic Films", Physics Letters, vol. 54A, No. 3, Sep. 8, 1975, pp. 225–226.
K. Matsuyama et al., "Fabrication of Microstructured Magnetic Tunneling Valve Junction", IEEE Transactions on Magnetics, vol. 31, No. 6, Nov. 1995, pp. 3176–3178.
J. S. Moodera et al., "Ferromagnetic–insulator–ferromagnetic Tunneling: Spin–dependent Tunneling and Large Magnetoresistance in Trilayer Junctions", Symposium on Spin Tunneling and Injection Phenomena, Journal of Applied Physics, vol. 79, No. 8, Apr. 15, 1996, pp. 4724–4729.

*Primary Examiner*—William J. Klimowicz
*Attorney, Agent, or Firm*—Thomas R. Berthold

[57] ABSTRACT

A magnetic tunnel junction (MTJ) magnetoresistive (MR) read head has one fixed ferromagnetic layer and one sensing ferromagnetic layer on opposite sides of the tunnel barrier layer, and with a biasing ferromagnetic layer in the MTJ stack of layers that is magnetostatically coupled with the sensing ferromagnetic layer to provide either longitudinal bias or transverse bias or a combination of longitudinal and transverse bias fields to the sensing ferromagnetic layer. The magnetic tunnel junction in the MTJ MR head is formed on an electrical lead on a substrate and is made up of a stack of layers. The layers in the stack are an antiferromagnetic layer, a fixed ferromagnetic layer exchange biased with the antiferromagnetic layer so that its magnetic moment cannot rotate in the presence of an applied magnetic field, an insulating tunnel barrier layer in contact with the fixed ferromagnetic layer, a sensing ferromagnetic layer in contact with the tunnel barrier layer and whose magnetic moment is free to rotate in the presence of an applied magnetic field, a biasing ferromagnetic layer that has its magnetic moment aligned generally within the plane of the device and a nonmagnetic electrically conductive spacer layer separating the biasing ferromagnetic layer from the other layers in the stack. The self field or demagnetizing field from the biasing ferromagnetic layer magnetostatically couples with the edges of the sensing ferromagnetic layer to stabilize its magnetic moment, and, to linearize the output of the device. The electrically conductive spacer layer prevents direct ferromagnetic coupling between the biasing ferromagnetic layer and the other layers in the stack and allows sense current to flow perpendicularly through the layers in the MTJ stack.

28 Claims, 7 Drawing Sheets

MAGNETIC TUNNEL JUNCTION MAGNETORESISTIVE SENSOR WITH IN-STACK BIASING

Related Applications

This application is related to application Ser. No. 09/087,533 titled "MAGNETIC TUNNEL JUNCTION MEMORY CELL WITH IN-STACK BIASING OF THE FREE FERROMAGNETIC LAYER AND MEMORY ARRAY USING THE CELL" and application Ser. No. 09/087,322 titled "MAGNETIC TUNNEL JUNCTION MAGNETORESISTIVE READ HEAD WITH LONGITUDINAL AND TRANSVERSE BIAS", both filed concurrently with this application.

TECHNICAL FIELD

This invention relates in general to a magnetic tunnel junction (MTJ) magnetoresistive (MR) sensor for sensing external magnetic fields, such as a MTJ MR read head for reading magnetically-recorded data. More particularly the invention relates to a MTJ MR sensor with biasing of the magnetic moment of the free or sensing ferromagnetic layer in the MTJ provided by an additional in-stack ferromagnetic layer.

BACKGROUND OF THE INVENTION

A magnetic tunnel junction (MTJ) device is comprised of two ferromagnetic layers separated by a thin insulating tunnel barrier layer and is based on the phenomenon of spin-polarized electron tunneling. One of the ferromagnetic layers has a higher saturation field in one direction of an applied magnetic field, typically due to its higher coercivity than the other ferromagnetic layer. The insulating tunnel barrier layer is thin enough that quantum mechanical tunneling occurs between the ferromagnetic layers. The tunneling phenomenon is electron-spin dependent, making the magnetic response of the MTJ a function of the relative orientations and spin polarizations of the two ferromagnetic layers.

MTJ devices have been proposed as memory cells for solid state memory and as external magnetic field sensors, such as MR read sensors or heads for magnetic recording systems. The response of the MTJ device is determined by measuring the resistance of the MTJ when a sense current is passed perpendicularly through the MTJ from one ferromagnetic layer to the other. The probability of tunneling of charge carriers across the insulating tunnel barrier layer depends on the relative alignment of the magnetic moments (magnetization directions) of the two ferromagnetic layers. The tunneling current is spin polarized, which means that the electrical current passing from one of the ferromagnetic layers, for example, a ferromagnetic layer whose magnetic moment is fixed or prevented from rotation, is predominantly composed of electrons of one spin type (spin up or spin down, depending on the orientation of the magnetic moment of the ferromagnetic layer). The degree of spin polarization of the tunneling current is determined by the electronic band structure of the magnetic material comprising the ferromagnetic layer at the interface of the ferromagnetic layer with the tunnel barrier layer. The first ferromagnetic layer thus acts as a spin filter. The probability of tunneling of the charge carriers depends on the availability of electronic states of the same spin polarization as the spin polarization of the electrical current in the second ferromagnetic layer. Usually, when the magnetic moment of the second ferromagnetic layer is parallel to the magnetic moment of the first ferromagnetic layer, there are more available electronic states than when the magnetic moment of the second ferromagnetic layer is aligned antiparallel to that of the first ferromagnetic layer. The tunneling probability of the charge carriers is highest when the magnetic moments of both layers are parallel, and is lowest when the magnetic moments are antiparallel. Thus, the electrical resistance of the MTJ depends on both the spin polarization of the electrical current and the electronic states in both of the ferromagnetic layers.

For a memory cell application one of the ferromagnetic layers in the MTJ has its magnetic moment fixed or pinned so as to be parallel or antiparallel to the magnetic moment of the other free or sensing ferromagnetic layer in the absence of an applied magnetic field within the cell. For a MR field sensor or read head application one of the ferromagnetic layers has its magnetic moment fixed or pinned so as to be generally perpendicular to the magnetic moment of the free or sensing ferromagnetic layer in the absence of an external magnetic field.

A MR sensor detects magnetic field signals through the resistance changes of a read element, fabricated of a magnetic material, as a function of the strength and direction of magnetic flux being sensed by the read element. The conventional MR sensor, such as that used as a MR read head for reading data in magnetic recording disk drives, operates on the basis of the anisotropic magnetoresistive (AMR) effect of the bulk magnetic material, which is typically permalloy ($Ni_{81}Fe_{19}$). A component of the read element resistance varies as the square of the cosine of the angle between the magnetization direction in the read element and the direction of sense current through the read element. Recorded data can be read from a magnetic medium, such as the disk in a disk drive, because the external magnetic is field from the recorded magnetic medium (the signal field) causes a change in the direction of magnetization in the read element, which in turn causes a change in resistance of the read element and a corresponding change in the sensed current or voltage.

The use of an MTJ device as a MR read head has been described in U.S. Pat. No. 5,390,061. One of the problems with such a MR read head, however, lies in developing a structure that generates an output signal that is both stable and linear with the magnetic field strength from the recorded medium. If some means is not used to stabilize the sensing ferromagnetic layer of the MTJ, i.e., to maintain it in a single magnetic domain state, the domain walls of magnetic domains will shift positions within the sensing ferromagnetic layer, causing noise which reduces the signal-to-noise ratio. This may give rise to a non-reproducible response of the head, when a linear response is required. Similarly the response of the MTJ MR read head must be approximately symmetric with regard to positive and negative sense fields.

The problem of maintaining a single magnetic domain state is especially difficult in the case of an MTJ MR read head because, unlike an AMR sensor, the sense current passes perpendicularly through the ferromagnetic layers and the tunnel barrier layer, and thus any metallic materials used to stabilize the sensing ferromagnetic layer that may come in contact with the ferromagnetic layers in the MTJ will short circuit the electrical resistance of the MTJ. IBM's U.S. Pat. No. 5,729,410 describes a MTJ MR read head with ferromagnetic material for longitudinally stabilizing or biasing the sensing ferromagnetic layer, wherein the biasing material is located outside the MTJ stack and separated from the stack by electrically insulating material.

What is needed is an MTJ device that has a stable and linear output and can thus function as an MTJ MR read head that provides a linear response to the magnetic fields from the recorded medium.

SUMMARY OF THE INVENTION

The invention is an MTJ MR read head with one fixed ferromagnetic layer and one sensing ferromagnetic layer on opposite sides of the tunnel barrier layer, and with a biasing ferromagnetic layer in the MTJ stack of layers that is magnetostatically coupled with the sensing ferromagnetic layer to provide either longitudinal bias or transverse bias or a combination of longitudinal and transverse bias fields to the sensing ferromagnetic layer. The magnetic tunnel junction in the MTJ MR head is formed on an electrical lead on a substrate and is made up of a stack of layers. The layers in the stack are an antiferromagnetic layer, a fixed ferromagnetic layer exchange biased with the antiferromagnetic layer so that its magnetic moment cannot rotate in the presence of an applied magnetic field, an insulating tunnel barrier layer in contact with the fixed ferromagnetic layer, a sensing ferromagnetic layer in contact with the tunnel barrier layer and whose magnetic moment is free to rotate in the presence of an applied magnetic field, a biasing ferromagnetic layer that has its magnetic moment aligned generally within the plane of the device and a nonmagnetic electrically conductive spacer layer separating the biasing ferromagnetic layer from the other layers in the stack. The self field or demagnetizing field from the biasing ferromagnetic layer magnetostatically couples with the edges of the sensing ferromagnetic layer to stabilize its magnetic moment, and, to linearize the output of the device. The electrically conductive spacer layer prevents direct ferromagnetic coupling between the biasing ferromagnetic layer and the other layers in the stack and allows sense current to flow perpendicularly through the layers in the MTJ stack. The biasing ferromagnetic layer may be a single relatively high coercivity material, a bilayer of a first lower coercivity ferromagnetic film and a second higher coercivity ferromagnetic film, or a ferromagnetic film interfacially exchange coupled to an antiferromagnetic film.

For a fuller understanding of the nature and advantages of the present invention, reference should be made to the following detailed description taken together with the accompanying figures.

DETAILED DESCRIPTION OF THE INVENTION

Prior Art

Although the MTJ device of the present invention will be described below as embodied as a MR sensor in a magnetic recording disk drive, the invention is also applicable to other magnetic recording systems, such as magnetic tape recording systems, and to other external magnetic field sensors.

Figure 1:
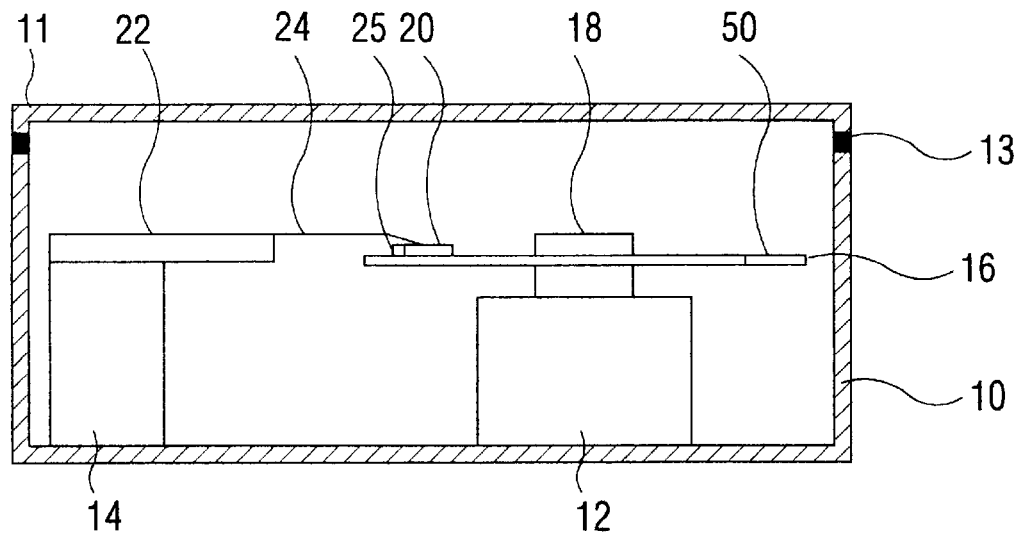
FIG. 1 is a simplified block diagram of a conventional magnetic recording disk drive for use with the MTJ MR read head according to the present invention.

Referring first to FIG. 1, there is illustrated in sectional view a schematic of a prior art disk drive of the type using a MR sensor. The disk drive comprises a base 10 to which are secured a disk drive motor 12 and an actuator 14, and a cover 11. The base 10 and cover 11 provide a substantially sealed housing for the disk drive. Typically, there is a gasket 13 located between base 10 and cover 11 and a small breather port (not shown) for equalizing pressure between the interior of the disk drive and the outside environment. A magnetic recording disk 16 is connected to drive motor 12 by means of hub 18 to which it is attached for rotation by the drive motor 12. A thin lubricant film 50 is maintained on the surface of disk 16. A read/write head or transducer 25 is formed on the trailing end of a carrier, such as an air-bearing slider 20. Transducer 25 is a read/write head comprising an inductive write head portion and a MR read head portion, as will be described with respect to FIG. 3. The slider 20 is connected to the actuator 14 by means of a rigid arm 22 and a suspension 24. The suspension 24 provides a biasing force which urges the slider 20 onto the surface of the recording disk 16. During operation of the disk drive, the drive motor 12 rotates the disk 16 at a constant speed, and the actuator 14, which is typically a linear or rotary voice coil motor (VCM), moves the slider 20 generally radially across the surface of the disk 16 so that the read/write head 25 may access different data tracks on disk 16.

Figure 2:
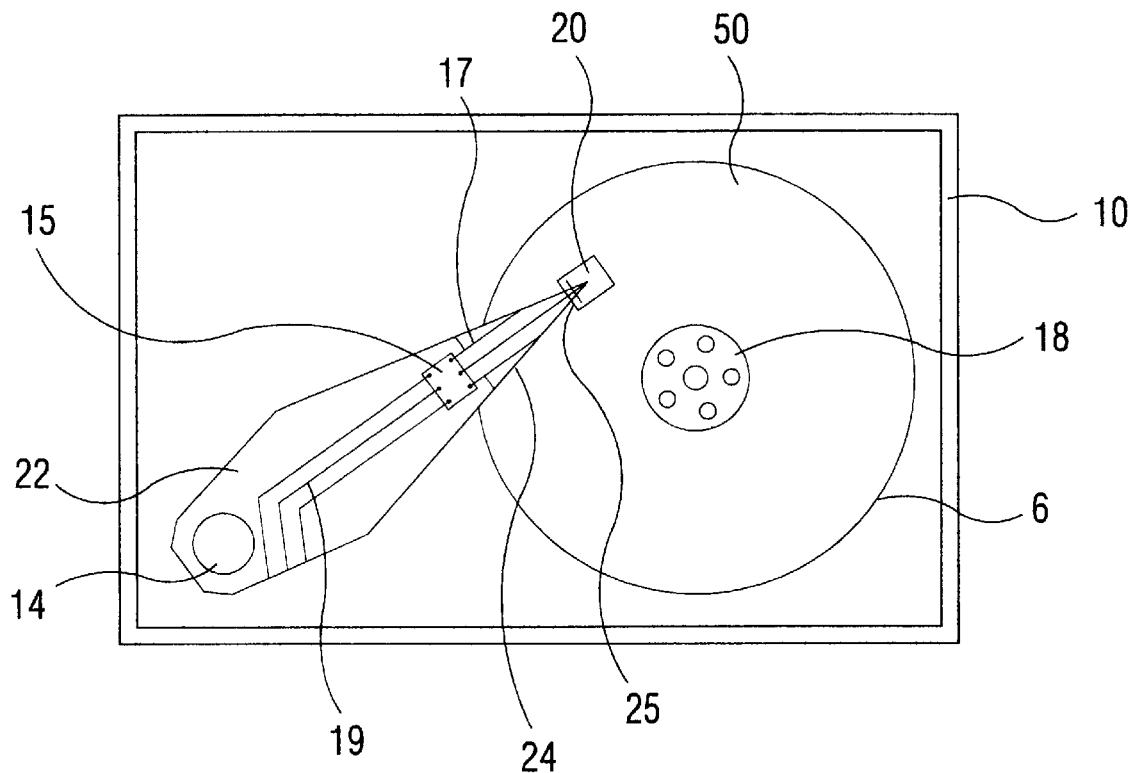
FIG. 2 is a top view of the disk drive of FIG. 1 with the cover removed.

FIG. 2 is a top view of the interior of the disk drive with the cover 11 removed, and illustrates in better detail the suspension 24 which provides a force to the slider 20 to urge it toward the disk 16. The suspension may be a conventional type of suspension, such as the well-known Watrous suspension, as described in IBM's U.S. Pat. No. 4,167,765. This type of suspension also provides a gimbaled attachment of the slider which allows the slider to pitch and roll as it rides on the air bearing. The data detected from disk 16 by the transducer 25 is processed into a data readback signal by signal amplification and processing circuitry in the integrated circuit chip 15 located on arm 22. The signals from transducer 25 travel via flex cable 17 to chip 15, which sends its output signals to the disk drive electronics (not shown) via cable 19.

Figure 3:
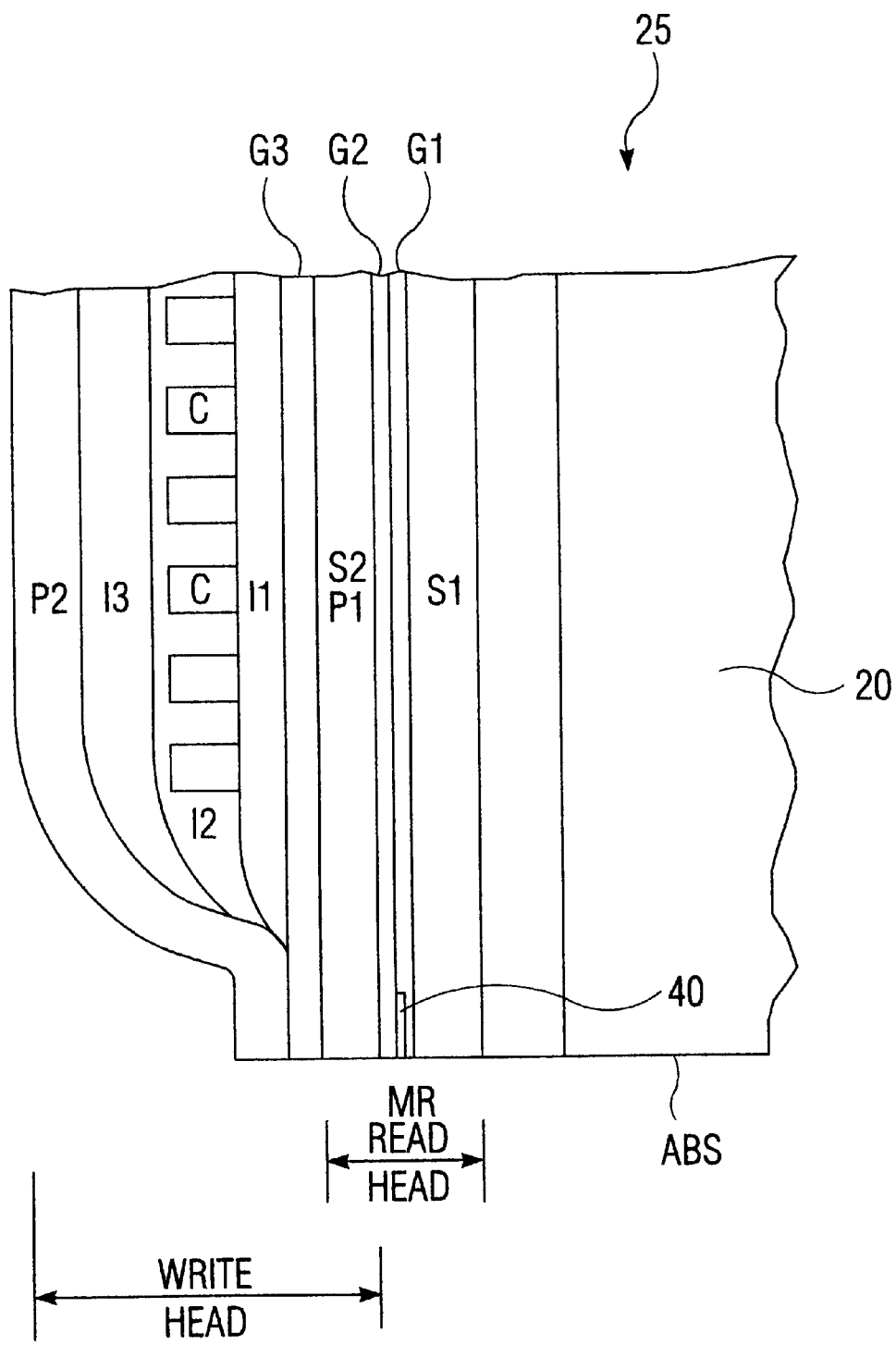
FIG. 3 is a vertical cross-section of a conventional inductive write head/MR read head with the MR read head located between shields and adjacent to the inductive write head.

FIG. 3 is a cross-sectional schematic view of the read/write head 25 which includes a MR read head portion and an inductive write head portion. The head 25 is lapped to form an air-bearing surface (ABS), the ABS being spaced from the surface of the rotating disk 16 (FIG. 1) by the air bearing as discussed above. The read head includes a MR sensor 40 sandwiched between first and second gap layers G1 and G2 which are, in turn, sandwiched between first and second shield layers S1 and S2. In a conventional disk drive, the MR sensor 40 is an AMR sensor. The write head includes a coil layer C and insulation layer 12 which are sandwiched between insulation layers I1 and I3 which are, in turn, sandwiched between first and second pole pieces P1 and P2. A gap layer G3 is sandwiched between the first and second pole pieces P1, P2 at their pole tips adjacent to the ABS for providing a magnetic gap. During writing, signal current is conducted through the coil layer C and flux is induced into the first and second pole layers P1, P2 causing flux to fringe across the pole tips at the ABS. This flux magnetizes circular tracks on the rotating disk 16 during a write operation. During a read operation, magnetized regions on the rotating disk 16 inject flux into the MR sensor 40 of the read head, causing resistance changes in the MR sensor 40. These resistance changes are detected by detecting voltage changes across the MR sensor 40. The voltage changes are processed by the chip 15 (FIG. 2) and drive electronics and converted into user data. The combined head 25 shown in FIG. 3 is a "merged" head in which the second shield layer S2 of the read head is employed as a first pole piece P1 for the write head. In a piggyback head (not shown), the second shield layer S2 and the first pole piece P1 are separate layers.

The above description of a typical magnetic recording disk drive with an AMR read head, and the accompanying FIGS. 1–3, are for representation purposes only. Disk drives may contain a large number of disks and actuators, and each actuator may support a number of sliders. In addition, instead of an air-bearing slider, the head carrier may be one which maintains the head in contact or near contact with the disk, such as in liquid bearing and other contact and near-contact recording disk drives.

Preferred Embodiments

The present invention is a MR read head with a MTJ sensor for use in place of the MR sensor 40 in the read/write head 25 of FIG. 3.

Figure 4A:
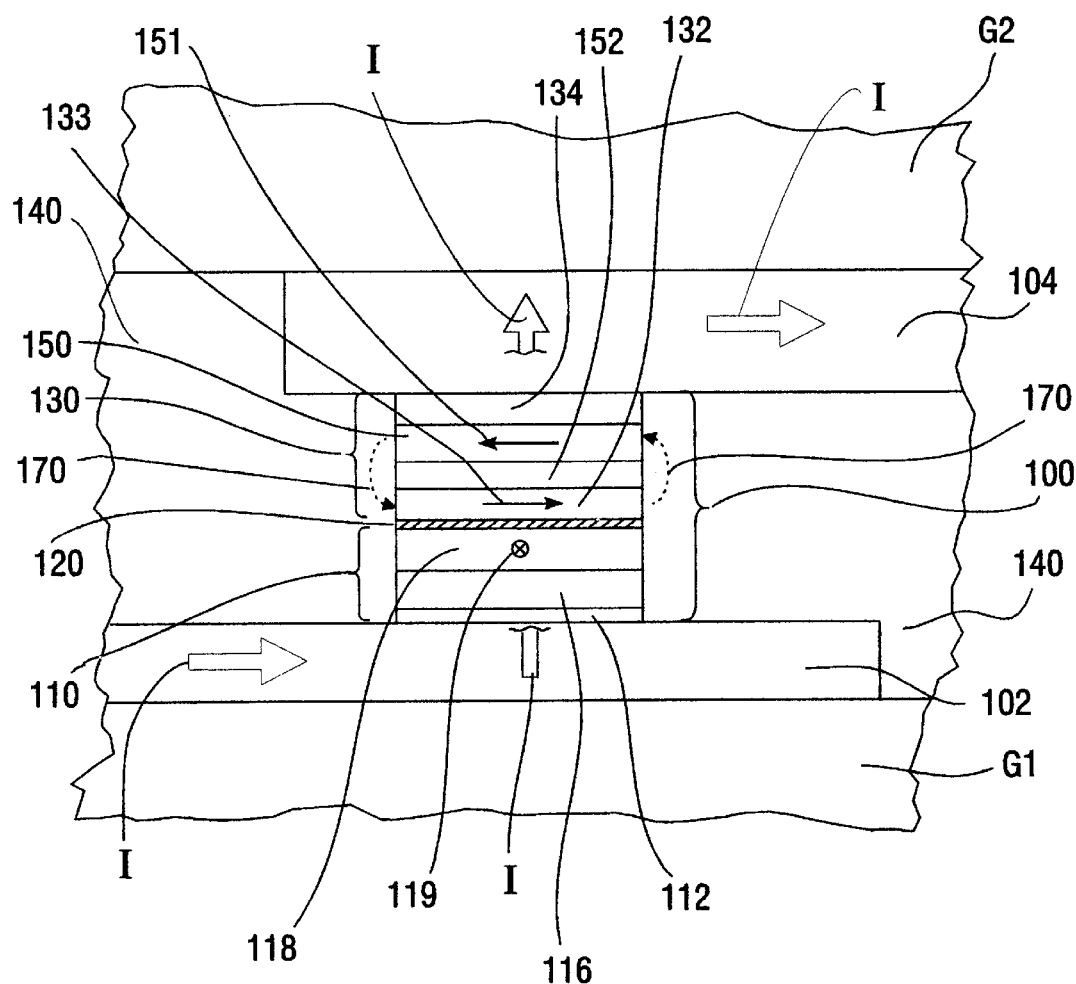
FIG. 4A is a cross-sectional view of a first embodiment of the MTJ MR read head of the present invention.

Referring first to FIG. 4A, the MTJ MR read head includes a bottom electrical lead 102 formed on the gap layer G1 substrate, a top electrical lead 104 below gap layer G2, and the MTJ 100 formed as a stack of layers between top and bottom electrical leads 102, 104 and surrounded by insulating alumina layer 140.

The MTJ 100 includes a first electrode multilayer stack 110, an insulating tunnel barrier layer 120, and a top electrode stack 130. Each of the electrodes 110, 130 includes a ferromagnetic layer in direct contact with tunnel barrier layer 120, i.e., ferromagnetic layers 118 and 132, respectively.

The base electrode layer stack 110 formed on electrical lead 102 includes a seed or "template" layer 112 on the lead 102, a layer of antiferromagnetic material 116 on the template layer 112, and a "fixed" ferromagnetic layer 118 formed on and exchange coupled with the underlying antiferromagnetic layer 116. The ferromagnetic layer 118 is called the fixed layer because its magnetic moment or magnetization direction is prevented from rotation in the presence of applied magnetic fields in the desired range of interest. The top electrode stack 130 includes a "sensing" ferromagnetic layer 132. The sensing ferromagnetic layer 132 is not exchange coupled to an antiferromagnetic layer, and its magnetization direction is thus free to rotate in the presence of applied magnetic fields in the range of interest. The sensing ferromagnetic layer 132 is fabricated so as to have its magnetic moment or magnetization direction (shown by arrow 133) oriented generally parallel to the ABS (FIG. 3) and generally perpendicular to the magnetization direction of the fixed ferromagnetic layer 118 in the absence of an applied magnetic field. The fixed ferromagnetic layer 118 in electrode stack 110 just beneath the tunnel barrier layer 120 has its magnetization direction fixed by interfacial exchange coupling with the immediately underlying antiferromagnetic layer 116, which also forms part of bottom electrode stack 110. The magnetization direction of the fixed ferromagnetic layer 118 is oriented generally perpendicular to the ABS, i.e., out of or into the paper in FIG. 4 (as shown by arrow tail 119).

Also shown in FIG. 4A as part of top electrode stack 130 is a biasing ferromagnetic layer 150 to provide bias fields for stabilizing the magnetization direction of the sensing ferromagnetic layer 132, and an electrically conductive nonferromagnetic spacer layer 152 separating and isolating the biasing layer 150 from the sensing ferromagnetic layer 132 and the other layers of the MTJ 100. Finally there is a protective or capping layer 134 formed on top on the biasing layer 150. In one embodiment the biasing ferromagnetic layer 150 is a "hard" (relatively high coercivity) magnetic material, such as a binary alloy of Co and Pt or a ternary CoPtX alloy where X may be, for example, Cr or Ni, that has its magnetic moment (shown by arrow 151) aligned antiparallel to the magnetic moment 133 of the sensing ferromagnetic layer 132 in the absence of an applied magnetic field. The spacer layer 152, which is preferably Cr or a Cr—V alloy has a thickness sufficient to prevent direct ferromagnetic coupling between the biasing layer 150 and the sensing ferromagnetic layer 132, but is still thin enough to permit magnetostatic coupling (shown by dashed arrows 170) with the sensing ferromagnetic layer 132. The minimum thickness for the spacer layer 152 is approximately 2 nm. In addition to Cr or Cr—V, other materials that will function as the electrically conductive spacer layer are Ta, Cu, Pd, Pt, Rh, Ti and titanium nitride (TiN), depending on the nature of the biasing layer 150.

Figure 5A:
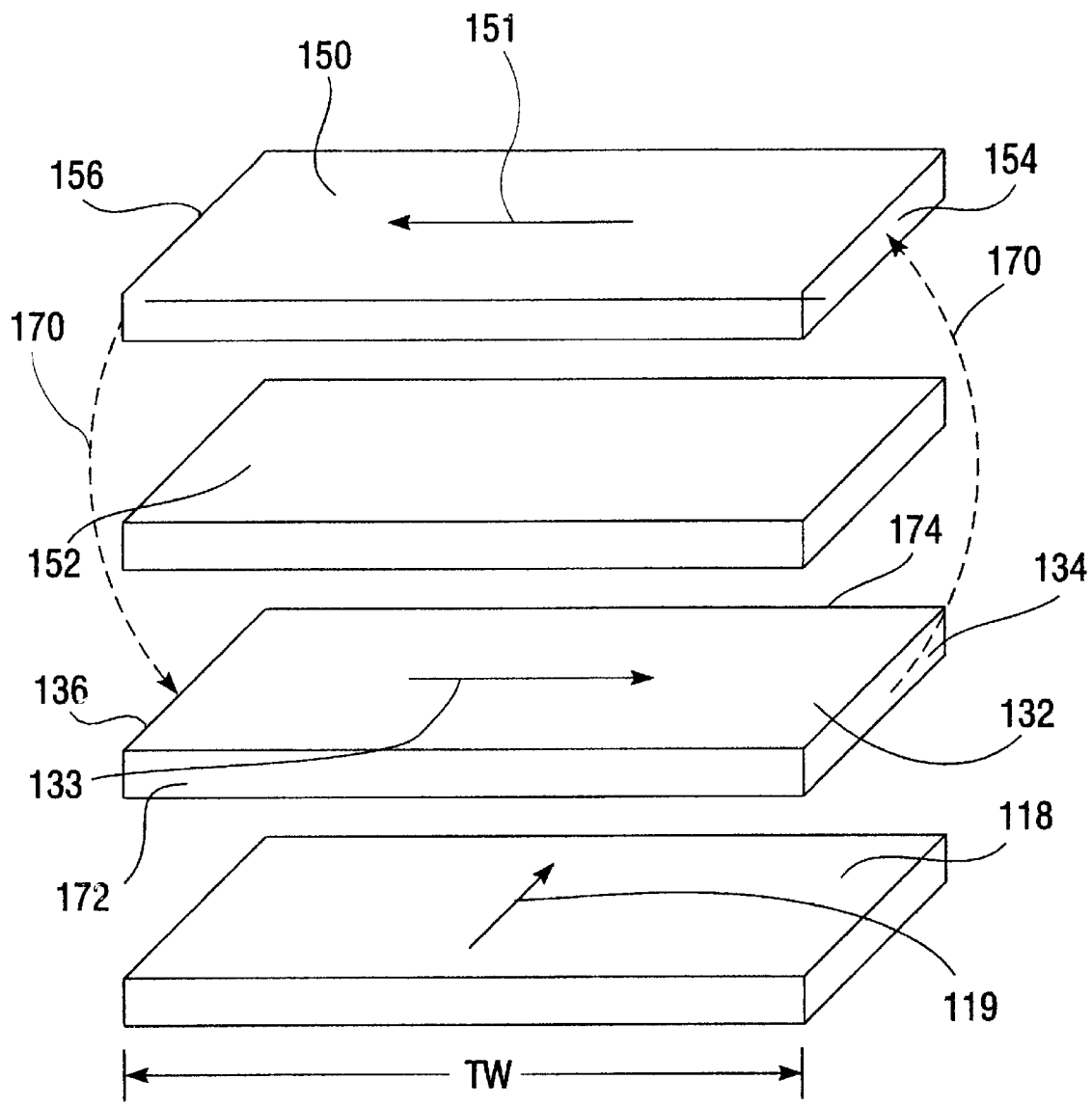
FIG. 5 is a schematic illustrating the magnetostatic coupling between the biasing ferromagnetic layer and the sensing ferromagnetic layer of the MTJ.

FIG. 5A illustrates the function of the self field or demagnetizing field from the biasing layer 150 when the moment of the biasing layer 150 is fixed in a direction approximately parallel to the ABS (FIG. 3) as indicated by the arrow 151 in FIG. 5A. The arrows 170 indicate the magnetostatic coupling between the edges 154 and 156 of the biasing layer 150 and the edges 134 and 136 of the sensing layer 132. The edges of the layers, such as edges 134, 136 of sensing layer 132, define the track width (TW) of the sensor. Linear operation of the MTJ MR head requires that the sensing ferromagnetic layer 132 have its magnetic moment aligned along the track width direction (arrow 133) and that the fixed ferromagnetic layer 118 have its magnetic moment aligned generally perpendicular to this direction (arrow 119) in the absence of an applied magnetic field. By setting the magnetic moment of the biasing ferromagnetic layer 150 to be along the track width direction but opposite or antiparallel to the magnetic moment of the sensing ferromagnetic layer 132 the self field from the biasing layer 150 will stabilize the magnetic moment of the sensing layer 132 at the track width edges 134 and 136. Thus the biasing layer 150 provides longitudinal bias to the sensing ferromagnetic layer 132 when the moment of the biasing layer 150 is set approximately parallel to the ABS and antiparallel to the moment of the sensing ferromagnetic layer 132.

Figure 5B:
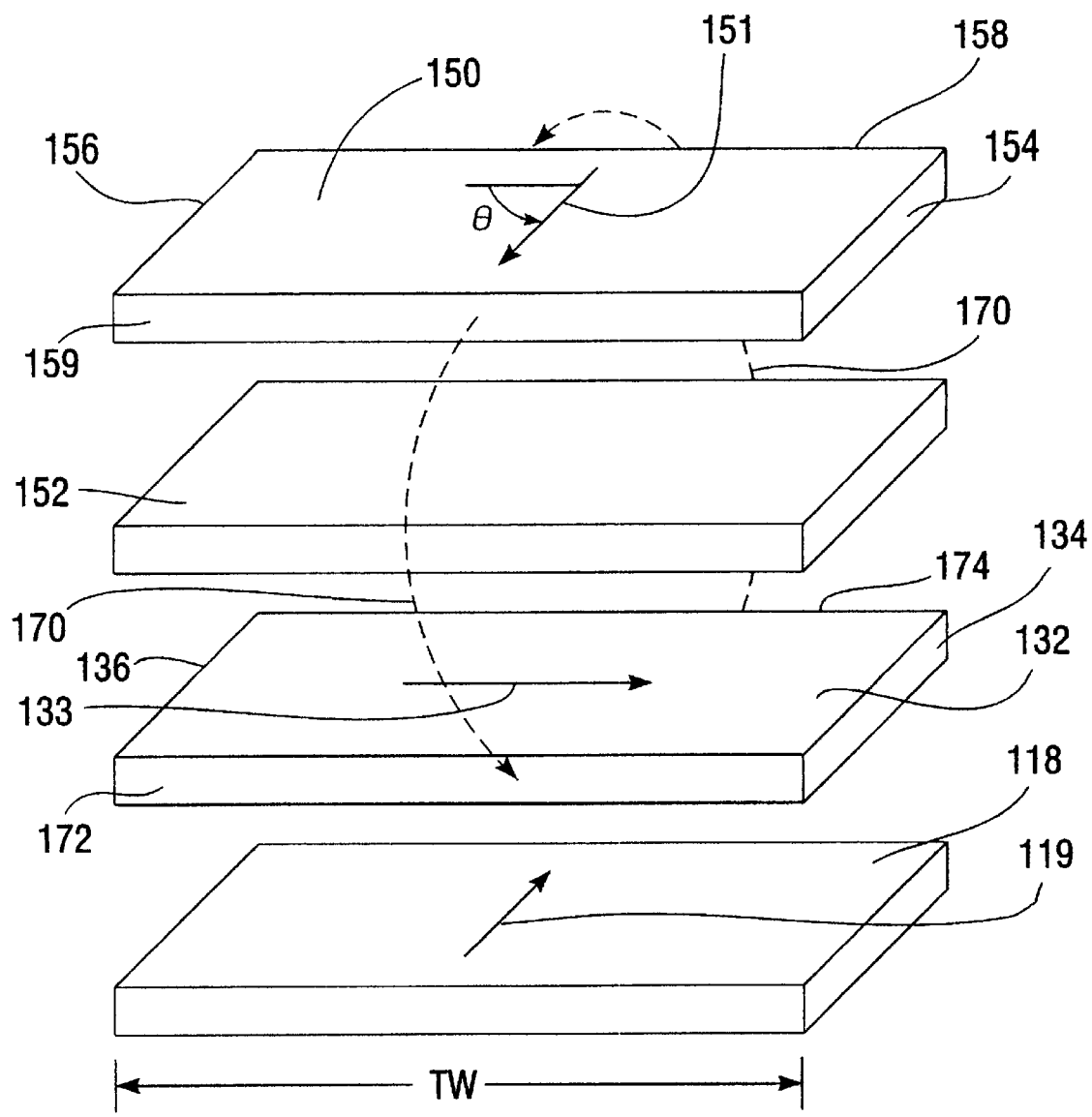

In an alternative embodiment illustrated in FIG. 5B the moment of the biasing layer 150 is set approximately orthogonal to the ABS and approximately along the direction 119 of the magnetic moment of the fixed layer 118. In this embodiment the moment of the biasing layer is shown by arrow 151 and provides a "transverse" magnetostatic coupling field. The arrows 170 in FIG. 5B indicate the resulting magnetostatic coupling between the edges 158 and 159 of the biasing layer 150 and the edges 172 and 174 of the sensing layer 132. In order to obtain a symmetric response of the MTJ device with regard to positive and negative sense fields it is necessary to ensure that in the absence of any sense field the magnetic moment of the sensing layer 132 is aligned approximately orthogonal to that of the fixed layer 118. Typically the magnetic moments of the sensing layer 132 and the fixed layer 118 are magnetically coupled to one another via a number of mechanisms which include the possibility of a ferromagnetic coupling field, $H_F$, which may result from roughness of the surfaces of the magnetic layers, as well as an antiferromagnetic coupling field, $H_D$, which results from magnetostatic coupling of the edges of the sensing and fixed layers. It is important to balance these coupling fields so that the sum of the coupling fields in the absence of any sense field is approximately zero. In conventional AMR sensors these coupling fields may be partially offset by the self-field provided by the sense current passing parallel to the layers of the sensor. In a MTJ device the current passes perpendicular to the sensor and cannot be used to provide such a field. Thus the biasing layer 150 is used to provide a transverse bias field which can be used to balance the coupling fields, $H_F$ and $H_D$. Note that in FIG. 5B the moment (arrow 151) of the biasing layer 150 is set in a direction approximately antiparallel to the moment 119 of the fixed layer 118. Thus the biasing layer 150 will provide a magnetostatic coupling field on the sensing layer 32 which is approximately in the same direction as any ferromagnetic coupling field between the fixed layer 118 and the sensing layer 132. By setting the moment of the biasing layer 150 in the opposite direction to that shown in FIG. 5B the biasing layer 150 will provide a magnetostatic coupling field at the sensing layer 132 which is along a direction approximately opposite to that of any ferromagnetic coupling field between the fixed layer 118 and the sensing layer 132. Thus in this case the magnetostatic coupling field provided by the biasing layer 150 would compensate to a greater or less extent the ferromagnetic coupling field, $H_F$.

Generally the moment of the biasing layer 150 can be set in any direction θ in the plane of the film 150 where θ is the angle between the direction of the moment of the biasing layer and the ABS (see FIG. 5B). In FIG. 5A θ is ~ zero degrees and in FIG. 5B θ is set at approximately 90 degrees. By setting θ at an intermediate angle, i.e., neither approximately parallel nor orthogonal to the ABS, then the biasing layer 150 can provide a combination of longitudinal and transverse bias. To assure stable longitudinal biasing (θ~0°) the product M*t of the biasing ferromagnetic layer 150 (where M is the magnetic moment per unit area of the material in a ferromagnetic layer and t is the thickness of the ferromagnetic layer) must be greater than or comparable to the M*t of the sensing ferromagnetic layer 132. For example, if the sensing ferromagnetic layer 132 is comprised of an alloy of Ni and Fe with the composition $Ni_{(100-x)}$—$Fe_{(x)}$ with x being approximately 19 then since its magnetic moment per unit area is about twice that of the magnetic moment per unit area of a typical hard magnetic material suitable for the biasing ferromagnetic layer 150, such as $Co_{75}Pt_{13}Cr_{12}$, the thickness of the biasing ferromagnetic layer 150 should be at least approximately twice that of the sensing ferromagnetic layer 132.

Figure 6:
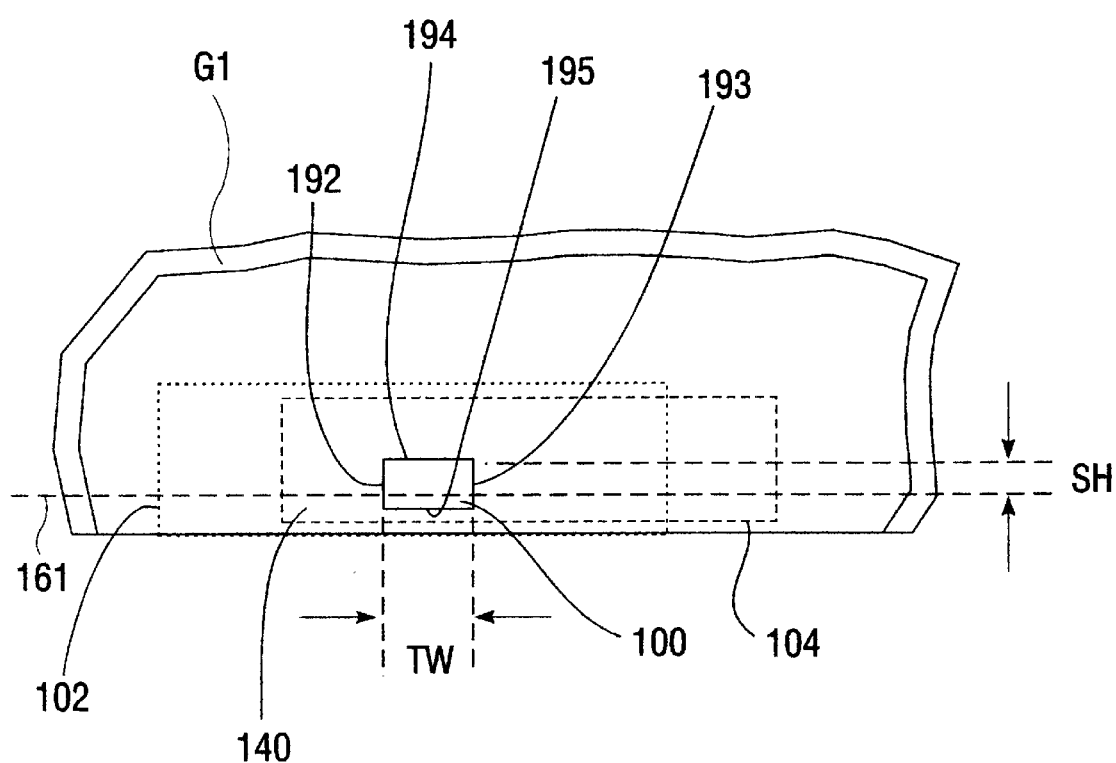
FIG. 6 is a top view of the MTJ MR read head of FIG. 4 illustrating the shape of the head and its position relative to the air-bearing surface (ABS) of the slider.

FIG. 6 is a top view of the MTJ MR head of FIG. 4A with the layers above and including the G2 layer removed and the top electrical lead 104 shown in dotted lines so that the underlying head can be illustrated. The dashed line 161 represents the ABS and the line to which the layers are lapped back after the MTJ MR head is fabricated. The MTJ 100 is depicted as a stripe having a width TW, appropriate to the track width of the recorded data on the disk, and a final stripe height SH after lapping. The width of the recorded data track is wider than TW.

Referring again to FIG. 4A, sense current I is directed from first electrical lead 102 perpendicularly through the antiferromagnetic layer 116, the fixed ferromagnetic layer 118, the tunnel barrier layer 120, the sensing ferromagnetic layer 132, the electrically conductive spacer layer 152, the biasing ferromagnetic layer 150 and then out through the second electrical lead 104. As described previously, the amount of tunneling current through the tunnel barrier layer 120 is a function of the relative orientations of the magnetizations of the fixed and sensing ferromagnetic layers 118, 132 that are adjacent to and in contact with the tunnel barrier layer 120. The magnetic field from the recorded data causes the magnetization direction of sensing ferromagnetic layer 132 to rotate away from the direction 133. This changes the relative orientation of the magnetic moments of the ferromagnetic layers 118, 132 and thus the amount of tunneling current, which is reflected as a change in electrical resistance of the MTJ 100. This change in resistance is detected by the disk drive electronics and processed into data read back from the disk. The spacer layer 152 separates the two ferromagnetic layers 132, 150 from one another. At the same time, the spacer layer 152 permits magnetostatic coupling between the edges of the biasing ferromagnetic layer 150 and the sensing ferromagnetic layer 132 to maintain a generally single magnetic domain state in sensing ferromagnetic layer 132 when the moment of biasing ferromagnetic layer 150 is set approximately parallel to the ABS (longitudinal bias). The biasing layer 150 and spacer layer 152 provide a linear output of the MTJ device with respect to sense magnetic fields when the moment of biasing layer 150 is set approximately orthogonal to the ABS (transverse bias), or alternatively provide a combination of longitudinal and transverse bias when the moment of the biasing layer 150 is set at an intermediate angle θ to the ABS.

A representative set of materials for MTJ 100 (FIG. 4A) will now be described. All of the layers of the MTJ 100 are grown in the presence of a magnetic field applied parallel to the surface of the substrate. The magnetic field serves to orient the easy axis of all of the ferromagnetic layers. In a conventional manufacturing apparatus the magnetic field can be rotated to the desired direction. A 5 nm Ta seed layer (not shown) is first formed on a 10–50 nm Au layer that serves as the bottom electrical lead 102. The seed layer is comprised of a material which encourages the (111) growth of the face-centered cubic (fcc) $Ni_{81}Fe_{19}$ template layer 112. The template ferromagnetic layer 112 encourages the growth of the antiferromagnetic layer 116. Suitable seed layer materials include fcc metals, such as Cu, as well as Ta or a combination of layers, such as 3–5 nm Ta/3–5 nm Cu. The MTJ base electrode stack 110 comprises a stack of 4 nm $Ni_{81}Fe_{19}$/10 nm $Mn_{50}Fe_{50}$/8 nm $Ni_{81}Fe_{19}$ (layers 112, 116, 118, respectively) grown on the Ta seed layer on the 10–20 nm Au layer 102. The Au layer 102 is formed on the alumina gap material G1 that serves as the substrate. Next, the tunnel barrier layer 120 is formed by depositing and then plasma oxidizing a 0.6–2 nm Al layer. This creates the $Al_2O_3$ insulating tunnel barrier layer 120. The top electrode stack 130 is a 5 nm $Ni_{81}Fe_{19}$ sensing ferromagnetic layer 132, a 3 nm Cr spacer layer 152, a 10 nm $Co_{75}Pt_{13}Cr_{12}$ biasing ferromagnetic layer 150 and a 10 nm Ta capping layer 134. The Ta layer 134 serves as a protective capping layer. The top electrode stack 130 is contacted by a 20 nm Au layer that serves as the top electrical lead 104.

Note that since the current passes perpendicular to the layers in MTJ 100, the resistance of the MTJ device will be largely dominated by that of the tunnel barrier layer 120. Thus, the resistance per unit area of the conductive leads 102, 104 can be much higher than in conventional MR read heads in which the current flows parallel to the layers. Thus, the leads 102, 104 can be made thinner and/or narrower than in conventional MR head structures, and/or can be made from intrinsically more resistive materials, such as alloys or combinations of elements.

It is important that the layers in the bottom electrode stack 110 be smooth, and that the $Al_2O_3$ tunnel barrier layer 120 be free of pinholes which would electrically short the junction. For example, growth by sputtering techniques known to produce good giant magnetoresistance effects in metallic multilayer stacks is sufficient. In the MTJ 100, the direction of the magnetic moments of the fixed and sensing ferromagnetic layers 118, 132, respectively, are approximately orthogonal to one another in zero applied magnetic field. The direction of the magnetic moment of the fixed layer 118 is largely determined by that of the exchange anisotropy field of the antiferromagnetic layer 116. The orientation of the magnetic moment of the sensing layer 132 is influenced by a number of factors, including the intrinsic anisotropy of the ferromagnetic layer itself and the shape of this layer. An intrinsic magnetic anisotropy can be induced in the sensing layer 132 by depositing it in a small magnetic field arranged to be perpendicular to that of the magnetization direction of the fixed layer 118. If the shape of the sensing layer 132 is not square, there may be a magnetic anisotropy resulting from the rectangular shape of the sensing layer. By choosing the length of the sensing layer (TW) to be longer than its height (SH), the shape anisotropy will favor the magnetic moment of the sensing layer to be oriented perpendicular to that of the fixed layer 118. Thus, the intrinsic and shape anisotropies can be arranged to favor the proper orientation of the magnetic moment of the sensing layer perpendicular to that of the fixed layer. However, neither of these anisotropies is essential for the proper operation of the MTJ MR head. Proper orientation of the magnetic moment of sensing layer 132 can be accomplished by the presence of the biasing layer 150 alone. The magnetostriction of the sensing layer 132 is arranged to be close to zero (by choice of composition of the Ni—Fe alloy) so that any stresses in this layer induced by the fabrication process do not, of themselves, lead to any magnetic anisotropy.

An alternative sensing ferromagnetic layer 132 may be comprised of a thin Co or $Co_{(100-x)}Fe_{(x)}$ or $Ni_{(100-x)}Fe_x$ (x is approximately 60) layer at the interface between the sensing ferromagnetic layer 132 and the tunnel barrier layer 120, with the bulk of layer 132 being a low magnetostriction material, such as $Ni_{(100-x)}Fe_x$ (x is approximately 19). The net magnetostriction of this type of sensing layer with a thin Co or $Co_{(100-x)}Fe_{(x)}$ or $Ni_{(100-x)}Fe_x$ (x is approximately 60) interface layer is arranged to have a value close to zero by slight variations of the composition of the bulk of layer 132. An alternative fixed ferromagnetic layer 118 may be comprised largely of a bulk $Ni_{(100-x)}Fe_{(x)}$ layer with a thin layer of a Co or $Co_{(100-x)}Fe_{(x)}$ or $Ni_{(100-x)}Fe_x$ (x is approximately 60) layer at the interface with the tunnel barrier layer 120. The largest signal is obtained with Co or with the highest polarization $Ni_{(100-x)}Fe_x$ (x is approximately 60) or $Co_{(100-x)}Fe_{(x)}$ alloy (x is approximately 70). The interface layer is optimally about 0.4–2 nm thick. The net magnetostriction of the combined layer is arranged to be close to zero by small variations of the composition. If the bulk of fixed layer 118 is Ni—Fe, then the composition is $Ni_{81}Fe_{19}$, the composition for which bulk Ni—Fe has zero magnetostriction.

The Fe—Mn antiferromagnetic layer 116 may be replaced with a Ni—Mn or Ir—Mn layer or other suitable antiferromagnetic layer which exchange biases the ferromagnetic material in the fixed layer 118 and which has a resistance which is substantially less than that of the $Al_2O_3$ barrier layer. Similarly, the stability of the fixed layer 118 can be increased further by forming it from a lamination of two ferromagnetic layers, such as Ni, Co, Ni—Fe alloys, Co—Fe alloys, or Ni—Fe—Co ternary alloys, separated by a thin metallic layer, which results in antiferromagnetic coupling of the two ferromagnetic layers. This type of laminated fixed layer is described in IBM's U.S. Pat. No. 5,465,185.

Figure 4B:
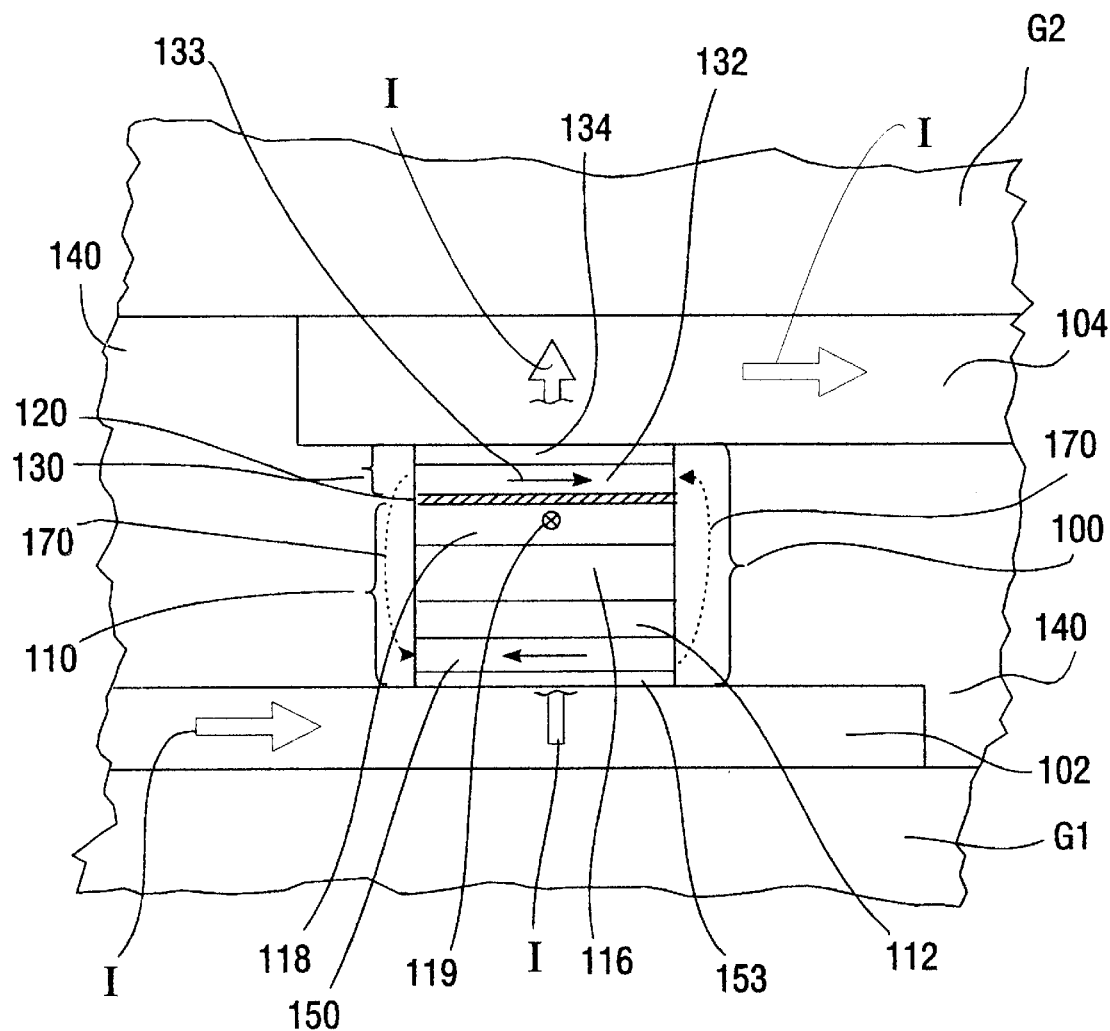
FIG. 4B is a cross-sectional view of a second embodiment of the MTJ MR read head of the present invention.

The MTJ MR head can also be fabricated with the biasing ferromagnetic layer 150 located below the fixed ferromagnetic layer 118 as illustrated in FIG. 4B. In this embodiment the biasing ferromagnetic layer 150 is formed on a seed layer 153 formed on the bottom lead 102. The seed layer 112 for the antiferromagnetic layer 116 is grown on top of the biasing layer 150. The combination of the seed layer 112 and the antiferromagnetic layer 116 also forms the spacer layer between the biasing layer 150 and the fixed layer 118. The layers 112 and 116 isolate the biasing layer 150 from the fixed layer 118 to prevent direct ferromagnetic coupling between the two layers, which would occur if they were in contact or not sufficently separated by a nonferromagnetic layer. In the embodiment of FIG. 4B the magnetostatic coupling between the edges of the biasing ferromagnetic layer 150 and the sensing ferromagnetic layer 132 occurs across the seed layer 112, the antiferromagnetic layer 116, the fixed ferromagnetic layer 118 and the tunnel barrier layer 120. The moment of the biasing layer 150 can be set in a direction largely parallel to the ABS to provide longitudinal bias to stabilize the magnetic domain structure within the sense layer 132 (as shown in FIG. 4B) or can be set at any angle in the plane of the film to provide a combination of longitudinal and transverse bias.

The process for fabricating the MTJ MR read head shown in FIG. 4A will now be described. The material for electrical lead 102 and the individual layers making up MTJ 100 are deposited on the G1 alumina layer as the substrate. Film growths are carried out by magnetron sputtering with argon (Ar) gas with the substrate at ambient temperature. Care must be taken to ensure that the sputter growth produces very smooth films. An applied magnetic field of magnitude 20–100 Oe, with the field direction in the plane of the substrate may be used to induce magnetic anisotropy into the ferromagnetic layers as they are grown. As part of the formation of the MTJ 100, the aluminum layer which is to become the tunnel barrier layer 120 is deposited and then subsequently plasma oxidized at an oxygen pressure of 100 mTorr and a power density of 25 W/cm$^2$ for 30–240 seconds. This forms the insulating tunnel barrier layer 120 of alumina. The plasma oxidation of the aluminum layer is done without breaking vacuum in the process.

Although not essential to the operation of the MTJ device, it may be beneficial to induce in the fixed 118, sensing 132 and biasing 150 ferromagnetic layers appropriate magnetic anisotropies by depositing these layers in approximately orthogonal magnetic fields. The fixed ferromagnetic layer 118 is grown in a field oriented along the direction 119 in FIG. 4A. Prior to the deposition of the sensing ferromagnetic layer 132 in the MTJ 100 and after formation of the alumina tunnel barrier layer 120, the magnet assembly that generates the external field is rotated approximately 90 degrees in the plane of the substrate so that the field applied during deposition is now oriented along the direction 133 in FIG. 4A. Alternatively, the substrate can be rotated.

The layers making up MTJ 100 and electrical lead 102 are then patterned into the shape of the bottom electrical lead 102. A positive photoresist is then applied to define the shape of MTJ 100 with a trackwidth TW defined by edges 192 and 193 and a height defined by edges 194 and 195, as illustrated in FIG. 6. Material is then removed from MTJ 100 by ion milling down to the electrical lead layer 102. Next, the alumina insulator layer 140 is deposited onto lead 102 over the photoresist and the photoresist is removed leaving alumina insulator layer everywhere except on the surface of MTJ 100 which is bounded by edges 192, 193, 194, 195. The fabrication of the MTJ MR head structure is then essentially complete, requiring only opening vias down to electrical lead 102, overlaying the top electrical lead 104 onto the top of MTJ 100, and setting of the magnetic moments.

Alternatively, when fabricating the MTJ 100 shape for very narrow geometries with TW and SH dimensions below 1.0 microns, two photoresist shapes or masks can be used. One shape has a critical feature which corresponds only to the trackwidth edges 192 and 193 but very large height. The second shape has a critical feature which corresponds only to the stripe height edges 194 and 195 but very large width. The subsequent process sequence is repeated twice. The first positive photoresist shape is applied, material is then removed from MTJ 100 by ion milling down to the electrical lead layer 102 and then alumina 140 is deposited onto lead 102 over the photoresist and the photoresist is removed. The second positive photoresist shape is then applied, material is then removed from MTJ 100 by ion milling down to the electrical lead layer 102 and then alumina 140 is deposited onto lead 102 over the photoresist and the photoresist is removed.

In order to obtain symmetric output characteristics for the MTJ device, the magnetization direction 133 of the ferromagnetic sensing layer 132 must be maintained in the approximate direction shown in FIGS. 4A and 4B, i.e., along the longitudinal direction with no transverse components. This is accomplished by balancing the ferromagnetic coupling field $H_F$ between the sensing and fixed ferromagnetic layers with the demagnetization field $H_D$ from the fixed ferromagnetic layer. Note that in an MTJ MR head, unlike a conventional AMR head, since the tunneling current is flowing normal to the layers of the structure, little field is induced from current flow in the films. $H_F$ depends critically on the nature of the interfaces between the ferromagnetic films and the actual junction and the thickness of the junction. $H_F$ can vary from several Oersteds (Oe) to 20–50 Oe. $H_D$ depends on the geometry of the sensor, i.e., final stripe height SH and fixed ferromagnetic layer thickness t, and the fixed ferromagnetic magnetization M, and varies approximately as $[4\pi \times (t/SH) \times M]$. Thus, for t=50 Å, SH=10,000 Å, M=800 emu/cm$^3$, $H_D$ is in the 40 Oe range. By varying the geometry of the sensor and the characteristics of the interfaces, $H_D$ can be approximately matched to $H_F$. One manner of balancing these two forces is to design a sensor that minimizes both fields. $H_D$ can be minimized by using the laminated antiparallel fixed layer described in the previously cited IBM U.S. Pat. No. 5,465,185. The net magnetic moment of such a layer is equivalent to the difference between the two pinned films, this difference being approximately 5 Å, so that $H_D$ is reduced to approximately 4 Oe. One can then optimize the interface to reduce $H_F$. In the present invention, by setting the moment of the biasing layer 150 at an angle to the ABS the magnetostatic coupling of biasing layer 150 to the sensing layer 132 provides a transverse bias field. This transverse bias field can be varied by varying the angle θ at which the moment of biasing layer 150 is set so as to match the sum of $H_D$ and $H_F$ so that there is no net transverse field on the sensing layer 132.

After the lead 104 has been patterned and the MTJ MR head structure is essentially complete, it is still necessary to align the magnetization of the fixed ferromagnetic layer 118 in the proper direction. The Fe—Mn layer 116 for exchange coupling with the fixed ferromagnetic layer 118 is antiferromagnetic as deposited. However, its magnetization must be realigned so that it can exchange couple the fixed ferromagnetic layer 118 in the proper orientation. The structure is placed in an annealing oven and the temperature is raised to approximately 180° C., which is greater than the blocking temperature of Fe—Mn. At this temperature, the Fe—Mn layer no longer gives rise to an exchange anisotropy with the fixed ferromagnetic layer 118. An exchange anisotropy of the ferromagnetic layer 118 is developed by cooling the pair of layers 116, 118 in a magnetic field. The orientation of the magnetization of the fixed ferromagnetic layer 118 will be along the direction of the magnetic field applied during cooling. The applied magnetic field in the annealing oven thus causes the moment of the fixed ferromagnetic layer 118 to be fixed along the required direction perpendicular to the ABS, as shown by arrow 119 in FIG. 4. This is a result of cooling the Fe—Mn layer in the presence of the ferromagnetic layer 118, magnetized by the applied magnetic field, in the required direction. Thus, at temperatures below the blocking temperature of Fe—Mn, in the presence of an applied magnetic field from the recorded medium, the magnetic moment of the fixed ferromagnetic layer 118 will not substantially rotate. Next, a magnetic field sufficient to fully magnetize the biasing ferromagnetic layer 150 is applied, preferably at room temperature, along a direction at an angle θ to the ABS. Thus, on reducing the applied magnetic field to approximately zero the magnetic moment of the biasing ferromagnetic layer 150 will be fixed along a direction θ to the ABS. When θ~0 then the moment of the biasing layer 150 will be approximately orthogonal to that of the moment of the fixed layer 118. Then by virtue of the magnetostatic coupling field arising from the biasing ferromagnetic layer 150 the moment of the sensing ferromagnetic layer 132 will tend to align itself approximately antiparallel to that of the moment of the biasing ferromagnetic layer 150.

The final stripe height SH of the MTJ 100 in the device is formed by lapping the lithographically-formed front sensing edge to line 161, thereby completing the structures shown in FIGS. 4A and 4B and 6.

The biasing ferromagnetic layer may be formed from a single layer of a high coercivity material such as an alloy of Co and one or more other elements, such as a Co—Pt binary alloy, or a Co—Pt—Cr ternary alloy (e.g. $Co_{75}Pt_{12}Cr_{13}$) or a Co—Pt—Ni ternary alloy or a Co—Cr—Ta ternary alloy. In addition to using a single layer of high coercivity material, such as CoPtCr, as the biasing ferromagnetic layer, there are two other structures that will serve as the biasing ferromagnetic layer. First, the biasing ferromagnetic layer may be a bilayer formed from a first ferromagnetic film of a lower coercivity material, such as 5 nm of Ni—Fe, and a second ferromagnetic film of a higher coercivity material, such as 10 nm of CoPtCr. The net coercivity of the bilayer will be between the coercivity of the two films making up the bilayer. Because the first film will have a higher moment per unit area than the second film, for the same thickness as a single layer of CoPtCr, the bilayer will have a higher M*t. This is an advantage when it is desired to minimize the total thickness of layers between the gap layers G1, G2 but still provide the value of M*t required to stabilize the sensing ferromagnetic layer. In addition, the presence of the soft ferromagnetic first film may decrease the direct coupling of the biasing layer to the neighboring ferromagnetic layer (the sensing layer 132 in FIG. 4A and the fixed layer 118 in FIG. 4B) across the corresponding spacer layer. Since the magnetic hardness of a hard ferromagnetic alloy such as a Co—Pt or Co—Pt—Cr alloy results from an inhomgeneous crystalline structure the magnetic moment distribution in the bising ferromagetic layer formed from such a hard magnetic material may also be inhomegeneous under the operating conditions of the MTJ device. Such inhomegeneity may lead to direct coupling of the biasing layer 150 to neighbouring magnetic layers but this may be reduced by the presence of a magnetically permeable homogenous ferromagnetic soft layer, such as the first film in the bilayer structure.

Second, the biasing ferromagnetic layer may be a ferromagnetic film and an antiferromagnetic film in contact with and interfacially exchange coupled with the first ferromagnetic film. The antiferromagnetic film secures the magnetic moment of the first ferromagnetic film in a direction antiparallel to the magnetic moment of the sensing ferromagnetic layer in the absence of an applied magnetic field. The ferromagnetic film may be Ni—Fe and the antiferromagnetic film may be Ni—Mn. In this embodiment the antiferromagnetic film must be made of a material that has a blocking temperature sufficiently distinct from the blocking temperature of the material used for the antiferromagnetic layer 116. Ni—Mn has a blocking temperature of up to higher than approximately 450° C. and Fe—Mn has a blocking temperature of approximately 200° C. Thus the exchange bias field provided by the antiferromagnetic layer with the higher blocking temperature is set first by heating the device to a temperature above this blocking temperature and cooling in a magnetic field oriented along the direction of whichever ferromagnetic layer (either 150 or 118) is exchange coupled to the antiferromagnetic layer with the higher blocking temperature. Then, in a second step, after cooling to a temperature slightly greater than the blocking temperature of the lower antiferromagnetic layer, the magnetic field orientation (or alternatively the device orientation) is rotated by 90 degree and the device is further cooled.

Note that if the biasing layer 150 is comprised of an exchange biased layer formed, for example, from a bilayer of a ferromagnetic layer of permalloy covered with an antiferromagnetic layer of FeMn then the most suitable spacer layer 152 is comprised of Ta, or alternatively a non-ferromagnetic Ni—Fe—Cr alloy layer. A suitable Ni—Fe—Cr alloy is one for which there is sufficient Cr that the alloy is non-ferromagnetic over the operating temperature range of the MTJ device. The spacer later 152 must be comprised of a material suitable for forming the exchange biased layer 150.

The MTJ MR head of the present invention with the in-stack biasing ferromagnetic layer is also capable of use where the fixed ferromagnetic layer 118 has its magnetic moment fixed by a technique other than interfacial exchange coupling with the antiferromagnetic layer 116. In this embodiment, the fixed ferromagnetic layer is comprised of a ferromagnetic material which has the property of high coercivity such that, in the presence of applied magnetic fields in the range of interest, the magnetic moment of this layer is essentially fixed or pinned by its intrinsic magnetic anisotropy. A suitable ferromagnetic material would be an alloy of Co and one or more other elements, such as a CoPtCr ternary alloy (e.g., $Co_{75}Pt_{12}Cr_{13}$) or a CoPtNi ternary alloy or a CoCrTa ternary alloy or a CoPt binary alloy. The magnetic properties of this hard or high coercivity fixed ferromagnetic layer may be affected by the seed layer on which it is grown. For example, a suitable seed layer for CoPtCr would be a layer of Cr. In this embodiment, if the biasing ferromagnetic layer 150 is also comprised of a high coercivity ferromagnetic layer then the coercivity of the biasing ferromagnetic layer 150 and the fixed ferromagnetic layer 118 must be sufficiently different that the magnetic moments of these layers can be set by applying magnetic fields of different magnitudes along the required respective directions 151 and 119 with the moment of the higher coercivity material being set first.

While the MTJ device described and shown in FIGS. 4A and 4B has the fixed ferromagnetic layer on the bottom of MTJ 100, the device can also be formed by depositing the sensing ferromagnetic layer first, followed by the tunnel barrier layer, the fixed ferromagnetic layer, and the antiferromagnetic layer. Such an MTJ device would then have the layers essentially inverted from the MTJ 100 shown in FIGS. 4A and 4B.

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A magnetic tunnel junction magnetoresistive sensor for sensing magnetic fields when connected to sense circuitry that detects changes in electrical resistance within the sensor, the sensor comprising:

a substrate;

a first electrically conductive lead formed on the substrate;

a magnetic tunnel junction stack of layers formed on the first lead and comprising a fixed ferromagnetic layer having its magnetic moment fixed in a preferred direction in the absence of an applied magnetic field, an insulating tunnel barrier layer in contact with the fixed ferromagnetic layer, a sensing ferromagnetic layer in contact with the insulating tunnel barrier layer, a biasing ferromagnetic layer for biasing the magnetic moment of the sensing ferromagnetic layer in a preferred direction in the absence of an applied magnetic field, and an electrically conductive nonferromagnetic spacer layer separating the biasing ferromagnetic layer from contact with the sensing ferromagnetic layer and the fixed ferromagnetic layer; and a second electrically conductive lead formed on and in contact with the magnetic tunnel junction stack; whereby when the electrical leads are connected to the sense circuitry the electrical resistance to current flow perpendicularly through the layers in said stack is determined by the relative magnetic moments of the fixed and sensing ferromagnetic layers.

2. The sensor according to claim 1 wherein the biasing ferromagnetic layer biases the magnetic moment of the sensing ferromagnetic layer in a direction substantially antiparallel to the magnetic moment of the biasing ferromagnetic layer in the absence of an applied magnetic field.

3. The sensor according to claim 1 wherein the biasing ferromagnetic layer biases the magnetic moment of the sensing ferromagnetic layer in a direction substantially parallel or antiparallel to the magnetic moment of the fixed ferromagnetic layer in the absence of an applied magnetic field.

4. The sensor according to claim 1 wherein the sensing ferromagnetic layer has a generally rectangular shape and wherein the biasing ferromagnetic layer has a magnetic moment within its plane that is oriented between greater than −90 degrees and less than +90 degrees, where 0 degrees corresponds to a longitudinal direction generally parallel to the length of the generally rectangularly shaped sensing layer.

5. The sensor according to claim 1 wherein the magnetic moments of the fixed and sensing ferromagnetic layers are oriented generally orthogonal to one another in the absence of an applied magnetic field.

6. The sensor according to claim 1 wherein the first electrical lead is the bottom lead, the magnetic tunnel junction stack is formed on the substrate such that the fixed ferromagnetic layer is in electrical connection with the first electrical lead, and the second electrical lead is the top lead and is in electrical contact with the sensing ferromagnetic layer.

7. The sensor according to claim 6 wherein the electrically conductive nonferromagnetic spacer layer is formed on top of the sensing ferromagnetic layer and wherein the biasing ferromagnetic layer is formed on top of the nonferromagnetic spacer layer, whereby the biasing ferromagnetic layer and the sensing ferromagnetic layer are separated from contact with one another.

8. The sensor according to claim 6 wherein the biasing ferromagnetic layer is formed between the bottom lead and the fixed ferromagnetic layer and further comprising an antiferromagnetic layer between the biasing ferromagnetic layer and the fixed ferromagnetic layer and in contact with the fixed ferromagnetic layer for fixing the magnetic moment of the fixed ferromagnetic layer in said preferred direction by interfacial exchange coupling, the antiferromagnetic layer further being electrically conductive and separating the biasing ferromagnetic layer and the sensing ferromagnetic layer from contact with one another.

9. The sensor according to claim 1 wherein the first electrical lead is a bottom lead located on the substrate beneath the stack of layers, wherein the biasing ferromagnetic layer is formed on top of the bottom lead, wherein the electrically conductive nonferromagnetic spacer layer is formed on top of the biasing ferromagnetic layer, and wherein the fixed ferromagnetic layer is formed on top of the nonferromagnetic spacer layer, whereby the biasing ferromagnetic layer and the fixed ferromagnetic layer are separated from contact with one another.

10. The sensor according to claim 1 wherein the first electrical lead is the bottom lead, the magnetic tunnel junction stack is formed on the substrate such that the sensing ferromagnetic layer is in electrical connection with the first electrical lead, and the second electrical lead is the top lead and is in electrical contact with the fixed ferromagnetic layer.

11. The sensor according to claim 1 wherein the magnetic tunnel junction stack further comprises an antiferromagnetic layer in contact with the fixed ferromagnetic layer for fixing the magnetic moment of the fixed ferromagnetic layer in said preferred direction by interfacial exchange coupling.

12. The sensor according to claim 1 wherein the biasing ferromagnetic layer comprises a single layer having a magnetic moment approximately equal to or greater than the magnetic moment of the sensing ferromagnetic layer.

13. The sensor according to claim 12 wherein the single biasing ferromagnetic layer is formed of an alloy comprising Co, Pt and Cr.

14. The sensor according to claim 1 wherein the biasing ferromagnetic layer comprises a bilayer of a first ferromagnetic film and a second ferromagnetic film having a coercivity higher than the coercivity of the first ferromagnetic film.

15. The sensor according to claim 14 wherein the first ferromagnetic film comprises an alloy of Ni and Fe, and wherein the second ferromagnetic film comprises an alloy of Co, Pt and Cr.

16. The sensor according to claim 1 wherein the biasing ferromagnetic layer comprises a ferromagnetic film and an antiferromagnetic film in contact with and interfacially exchange coupled with the ferromagnetic film of the biasing ferromagnetic layer.

17. The sensor according to claim 16 wherein the ferromagnetic film of the biasing ferromagnetic layer comprises an alloy of Ni and Fe, and wherein the antiferromagnetic film comprises an alloy of Ni and Mn.

18. A magnetic tunnel junction magnetoresistive read head for sensing data magnetically recorded on a medium, the head having a sensing surface for facing the medium and comprising:

a substrate;

a bottom electrical lead formed on the substrate;

a fixed ferromagnetic layer formed over the bottom lead, the magnetization direction of the fixed ferromagnetic layer being fixed along a direction generally perpendicular to the sensing surface so as to be substantially prevented from rotation in the presence of an applied magnetic field from the medium;

an insulating tunneling barrier layer located on and in contact with the fixed ferromagnetic layer;

a sensing ferromagnetic layer located on and in contact with the tunneling barrier layer and whose magnetization is oriented in a direction generally parallel to the sensing surface and generally perpendicular to the magnetization direction of the fixed ferromagnetic layer in the absence of an applied magnetic field and is free to rotate in the presence of an applied magnetic field from the medium;

a biasing ferromagnetic layer having a magnetic moment that is oriented between approximately −90 degrees and approximately +90 degrees, where 0 degrees corresponds to a longitudinal direction generally parallel to the sensing surface, for stabilizing the magnetization direction of the sensing ferromagnetic layer;

an electrically conductive nonferromagnetic spacer layer located between the biasing ferromagnetic layer and the fixed ferromagnetic layer; and a top electrical lead for providing electrical connection with the sensing ferromagnetic layer, whereby the electrical resistance to current flow perpendicularly through the layers located between the bottom and top leads is determined by the relative magnetic moments of the fixed and sensing ferromagnetic layers.

19. The head according to claim 18 further comprising an antiferromagnetic layer located between the biasing ferromagnetic layer and the fixed ferromagnetic layer for fixing the magnetic moment of the fixed ferromagnetic layer by interfacial exchange coupling.

20. The head according to claim 18 wherein the spacer layer comprises an antiferromagnetic layer located between the biasing ferromagnetic layer and the fixed ferromagnetic layer for fixing the magnetic moment of the fixed ferromagnetic layer by interfacial exchange coupling.

21. The head according to claim 18 wherein the biasing ferromagnetic layer comprises a single layer having a magnetic moment approximately equal to or greater than the magnetic moment of the sensing ferromagnetic layer.

22. The head according to claim 21 wherein the single biasing ferromagnetic layer is formed of an alloy comprising Co, Pt and Cr.

23. The head according to claim 18 wherein the biasing ferromagnetic layer comprises a bilayer of a first ferromagnetic film and a second ferromagnetic film having a coercivity higher than the coercivity of the first ferromagnetic film.

24. The head according to claim 23 wherein the first ferromagnetic film comprises an alloy of Ni and Fe, and wherein the second ferromagnetic film comprises an alloy of Co, Pt and Cr.

25. The head according to claim 18 wherein the biasing ferromagnetic layer comprises a ferromagnetic film and an antiferromagnetic film in contact with and interfacially exchange coupled with the ferromagnetic film of the biasing ferromagnetic layer.

26. The head according to claim 25 wherein the ferromagnetic film of the biasing ferromagnetic layer comprises an alloy of Ni and Fe, and wherein the antiferromagnetic film comprises an alloy of Ni and Mn.

27. The head according to claim 18 wherein the biasing ferromagnetic layer's magnetic moment is oriented at approximately 0 degrees so as to provide longitudinal biasing of the sensing ferromagnetic layer.

28. The sensor according to claim 18 wherein the biasing ferromagnetic layer's magnetic moment is oriented at approximately −90 degrees or +90 degrees so as to provide transverse biasing of the sensing ferromagnetic layer.

* * * * *